(12) United States Patent
Cao et al.

(10) Patent No.: US 11,502,502 B2
(45) Date of Patent: Nov. 15, 2022

(54) POWER MANAGEMENT CIRCUIT WITH OVER-CURRENT PROTECTION AND OVER-CURRENT PROTECTION METHOD THEREOF

(71) Applicant: Chengdu Monolithic Power Systems Co., Ltd., Chengdu (CN)

(72) Inventors: Haigang Cao, Hangzhou (CN); Shengyong Yi, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 17/529,425

(22) Filed: Nov. 18, 2021

(65) Prior Publication Data

US 2022/0181867 A1 Jun. 9, 2022

(30) Foreign Application Priority Data

Dec. 3, 2020 (CN) .......................... 202011414871.X (51) Int. Cl.
| | | |
|---|---|---|
| *H02H 3/087* | (2006.01) | |
| *H02H 1/00* | (2006.01) | |
| *H02H 9/02* | (2006.01) | |
| *H02M 3/155* | (2006.01) | |
| *H03K 3/037* | (2006.01) | |

(52) U.S. Cl.
CPC .......... *H02H 3/087* (2013.01); *H02H 1/0007* (2013.01); *H02H 9/02* (2013.01); *H02M 3/155* (2013.01); *H03K 3/037* (2013.01)

(58) Field of Classification Search
CPC .......... H02H 3/025; H02H 3/08; H02H 3/087; H02H 3/093; H02H 9/02; H02H 9/025
See application file for complete search history.

(56) References Cited

U.S. PATENT DOCUMENTS

| | | |
|---|---|---|
| 10,110,037 B2 | 1/2018 | Ouyang |
| 10,381,854 B2 | 8/2019 | Xu et al. |
| 2017/0040792 A1* | 2/2017 | Li ............................ H02M 1/32 |
| 2017/0288662 A1* | 10/2017 | Djelassi ........... H03K 17/08122 |
| 2020/0036209 A1 | 1/2020 | Chang |
| 2022/0060011 A1* | 2/2022 | Yousef ..................... H02H 3/08 |

\* cited by examiner

*Primary Examiner* — Jared Fureman
*Assistant Examiner* — Christopher J Clark
(74) *Attorney, Agent, or Firm* — Perkins Coie LLP (57) ABSTRACT

A power management circuit has a power input terminal coupled to a power supply or a load, a power terminal configured to provide an output voltage, and a battery terminal coupled to a battery. The power management circuit further has a current limiting circuit, an over-current indication circuit and an over-current threshold selecting circuit. The current limiting circuit compares a current feedback signal indicative of an output current flowing out of the power terminal with a current threshold signal and generates a square wave signal. The over-current indication circuit generates an over-current indication signal based on the square wave signal. The over-current threshold selecting circuit selects a first over-current threshold voltage or a second over-current threshold voltage as an over-current threshold voltage based on the over-current indication signal, wherein the first over-current threshold voltage is higher than the second over-current threshold voltage.

20 Claims, 6 Drawing Sheets

POWER MANAGEMENT CIRCUIT WITH OVER-CURRENT PROTECTION AND OVER-CURRENT PROTECTION METHOD THEREOF

CROSS-REFERENCE TO RELATED APPLICATIONS

This application claims the benefit of CN application No. 202011414871.X, filed on Dec. 3, 2020, and incorporated herein by reference.

TECHNICAL FIELD

The present invention generally relates to electronic circuits, and more particularly but not exclusively, to power management circuits and associated over-current protection (OCP) methods.

BACKGROUND

Figure 1:
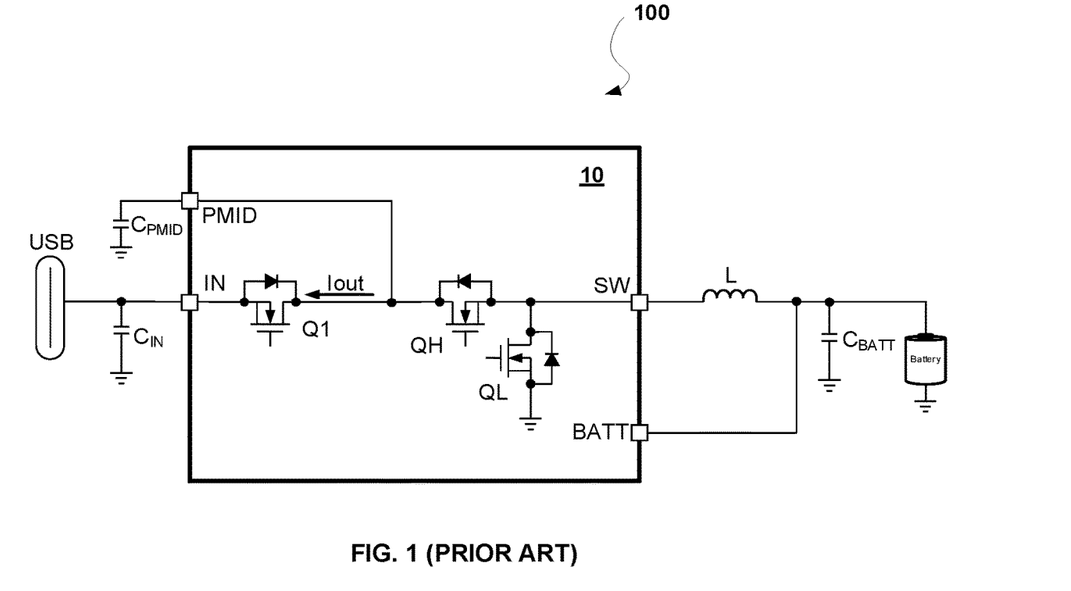
FIG. 1 illustrates a prior power management circuit 100.

FIG. 1 illustrates a prior power management circuit 100. An integrated circuit 10 of the power management 100 comprises a power input terminal IN, a power terminal PMID, a switch node terminal SW, a battery terminal BATT, a first switch Q1, power switches QH and QL. The power input terminal IN is coupled to a power supply which provides an input voltage to the power management circuit 100 or to a load which receives a supply voltage from the power management circuit 100.

When the input voltage exists at the power input terminal IN, the first switch Q1 is turned on so that the input voltage can be transferred to the power terminal PMID via the first switch Q1 for providing an output voltage Vout. The power switches QH, QL and an inductor L perform step-down conversion to charge a rechargeable battery.

When the power input terminal IN is coupled to the load (On The Go mode, OTG mode), the first switch Q1 is turned on so that the output voltage Vout at the power terminal PMID can be transferred to the power input terminal IN for supplying power to the load, e.g., a mobile phone, and providing an output current Iout flowing out of the power terminal PMID. The power switches QH, QL and the inductor L perform step-up conversion to transfer power from the rechargeable battery to the power terminal PMID for providing the output voltage Vout. In operation, when the output current Iout is lower than a preset current threshold, a constant-voltage (CV) control loop works to control the output voltage Vout to be a constant voltage. When the output current Iout reaches the preset current threshold, a constant-current (CC) control loop replaces the CV control loop to work, and the output current Iout is controlled to be a constant current.

In some applications, e.g., when supplying power to Apple's mobile products, the power management circuit 100 works on the OTG mode and needs to allow a maximum of 1.6 times overload for a duration of 2 ms. Moreover, the output voltage Vout is required to not be lower than 2V during the 2 ms. However, in the prior art, when the CC control loop starts to work, the output voltage Vout will decrease, which can not meet the power supply standards of Apple's mobile products.

SUMMARY

An embodiment of the present invention discloses an integrated circuit adapted for using with a first load, a battery, an inductor and an output capacitor, the integrated circuit comprising: a first terminal for providing an output voltage; a first switch coupled between the first terminal and a second terminal; a first power switch coupled between the first terminal and a third terminal; a second power switch coupled to the third terminal; and a control circuit. The control circuit is configured to boost a battery voltage of the battery to the output voltage at the first terminal and the control circuit turns on the first switch to transfer the output voltage at the first terminal to the second terminal for supplying power to the first load when the second terminal is coupled to the first load, wherein the control circuit comprises a current limiting circuit, an over-current indication circuit and an over-current threshold selecting circuit. The current limiting circuit is configured to receive a current threshold signal and a current feedback signal indicative of an output current flowing out of the first terminal, the current limiting circuit compares the current feedback signal with the current threshold signal and generates a square wave signal. The over-current indication circuit is coupled to an output terminal of the current limiting circuit to receive the square wave signal and configured to output an over-current indication signal based on the square wave signal. The over-current threshold selecting circuit is configured to select a first over-current threshold voltage or a second over-current threshold voltage as an over-current threshold voltage based on the over-current indication signal, wherein the first over-current threshold voltage is higher than the second over-current threshold voltage.

An embodiment of the present invention discloses a power management circuit comprising a first terminal for providing an output voltage; a first switch coupled between the first terminal and a second terminal; a bi-directional DC/DC converter coupled between the first terminal and a third terminal and a control circuit. The control circuit is configured to boost a battery voltage at the third terminal to an output voltage at the first terminal through the bi-directional DC/DC converter and the control circuit turns on the first switch to transfer the output voltage at the first terminal to the second terminal for supplying power to a first load when the second terminal is coupled to the first load, wherein the control circuit comprises a current limiting circuit, an over-current indication circuit and an over-current threshold selecting circuit. The current limiting circuit is configured to receive a current threshold signal and a current feedback signal indicative of an output current flowing out of the first terminal, the current limiting circuit compares the current feedback signal with the current threshold signal and generates a square wave signal at an output terminal. The over-current indication circuit is coupled to the output terminal of the current limiting circuit to receive the square wave signal and configured to output an over-current indication signal based on the square wave signal. The over-current threshold selecting circuit is configured to select a first over-current threshold voltage or a second over-current threshold voltage as an over-current threshold voltage based on the over-current indication signal, wherein the first over-current threshold voltage is higher than the second over-current threshold voltage.

An embodiment of the present invention discloses an over-current protection method used in a power management circuit. The power management circuit comprises a first switch coupled between a power input terminal and a power terminal, a bi-directional DC/DC converter coupled between the power terminal and a battery terminal, and a rechargeable battery coupled to the battery terminal. Wherein when the power input terminal is coupled to a first load, the bi-directional DC/DC converter boosts a battery voltage to an output voltage at the power terminal and transfers the output voltage to the power input terminal for supplying power to the first load. The OCP method comprises the following steps: 1) sensing an output current flowing out of the power terminal and generating a current feedback signal; 2) comparing the current feedback signal with a current threshold signal and generating a square wave signal based on the comparison result; 3) generating an over-current indication signal based on the square wave signal; 4) selecting a first over-current threshold voltage or a second over-current threshold voltage as an over-current threshold voltage based on the over-current indication signal, wherein the first over-current threshold voltage is higher than the second over-current threshold voltage; 5) when the current feedback signal reaches the over-current threshold voltage, a CC control loop is configured to control the output current to be a constant current; and 6) when the current feedback signal is lower than the over-current threshold voltage, a CV control loop is configured to control the output voltage to be a constant voltage.

BRIEF DESCRIPTION OF THE DRAWING

The present invention can be further understood with reference to the following detailed description and the appended drawings, wherein like elements are provided with like reference numerals.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Reference to "one embodiment", "an embodiment", "an example" or "examples" means: certain features, structures, or characteristics are contained in at least one embodiment of the present invention. These "one embodiment", "an embodiment", "an example" and "examples" are not necessarily directed to the same embodiment or example. Furthermore, the features, structures, or characteristics may be combined in one or more embodiments or examples. In addition, it should be noted that the drawings are provided for illustration, and are not necessarily to scale. And when an element is described as "connected" or "coupled" to another element, it can be directly connected or coupled to the other element, or there could exist one or more intermediate elements. In contrast, when an element is referred to as "directly connected" or "directly coupled" to another element, there is no intermediate element.

Figure 2:
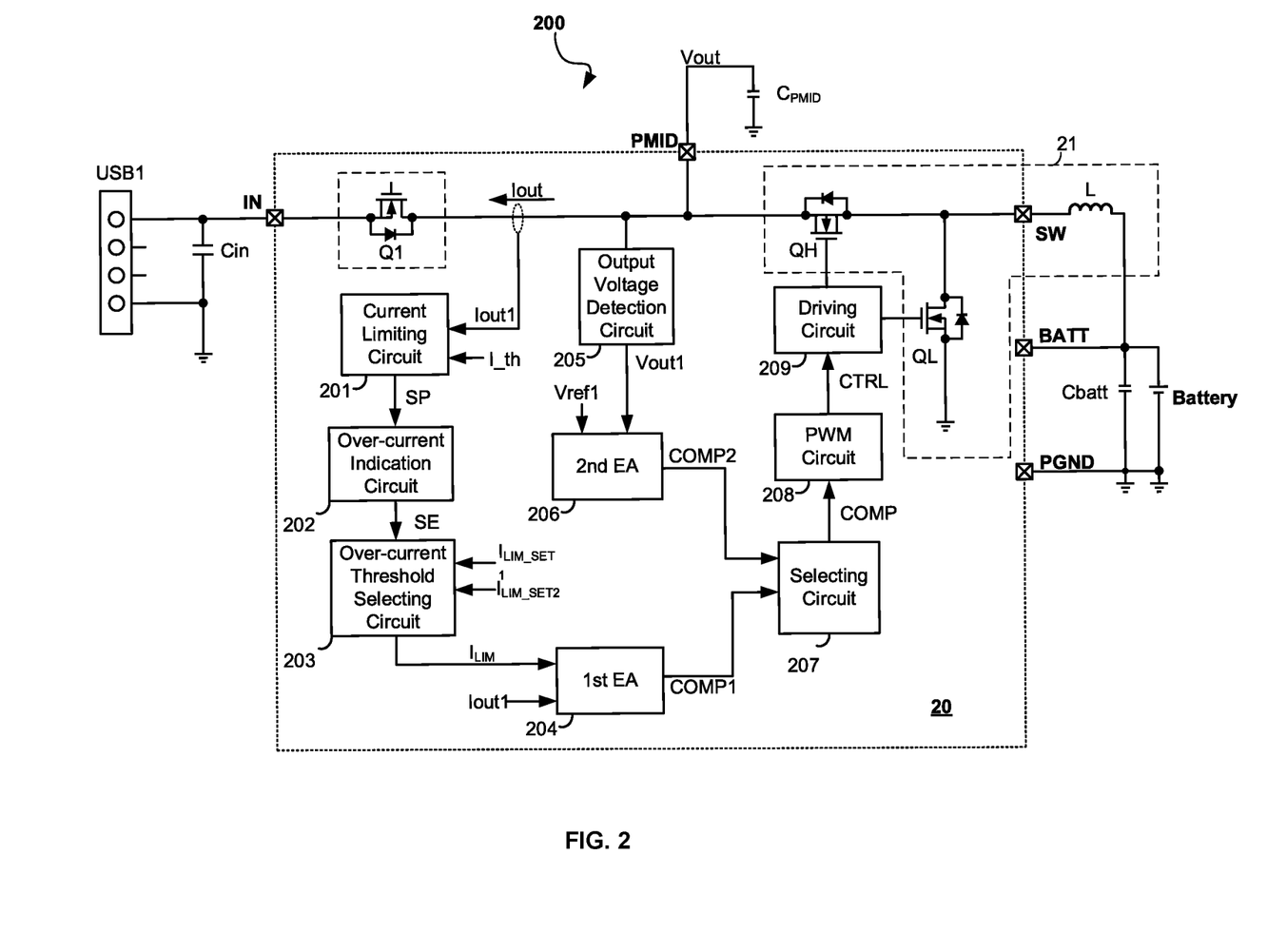
FIG. 2 illustrates a power management circuit 200 in accordance with an embodiment of the present invention.

FIG. 2 illustrates a power management circuit 200 in accordance with an embodiment of the present invention. In the example shown in FIG. 2, the power management circuit 200 comprises an integrated circuit 20, an input capacitor Cin, a rechargeable battery, an inductor L, an output capacitor $C_{PMID}$ and a battery capacitor Cbatt. The integrated circuit 20 comprises a power input terminal IN, a power terminal PMID, a switch node terminal SW, a battery terminal BATT, a ground terminal PGND, a first switch Q1, a first power switch QH, a second power switch QL and a control circuit used in the integrated circuit 20.

The first power switch QH, the second power switch QL and the inductor L construct a bi-directional DC/DC converter 21. When an input voltage exists at the power input terminal IN, the first switch Q1 is turned on so that the input voltage can be transferred to the power terminal PMID via the first switch Q1 for providing an output voltage Vout. The bi-directional DC/DC converter 21 performs step-down conversion to charge the rechargeable battery.

When the power input terminal IN is coupled to a first load, the first switch Q1 is turned on so that the output voltage Vout can be transferred to the power input terminal IN for supplying power to the first load, e.g., a mobile phone, and providing an output current Iout flowing out of the power terminal PMID. The bi-directional DC/DC converter 21 performs step-up conversion to transfer the power from the rechargeable battery to the power terminal PMID for providing the output voltage Vout.

The control circuit of the integrated circuit 20 comprises a current limiting circuit 201, an over-current indication circuit 202, an over-current threshold selecting circuit 203, a first error amplifier (EA) 204, an output voltage detection circuit 205, a second EA 206, a selecting circuit 207, a pulse width modulation (PWM) circuit 208 and a driving circuit 209.

The current limiting circuit 201 has a first input terminal, a second input terminal and an output terminal, wherein the first input terminal is configured to receive a current threshold signal I_th, the second input terminal is configured to receive a current feedback signal Iout1 indicative of the output current Iout flowing out of the power terminal PMID. The current limiting circuit 201 is configured to compare the current feedback signal Iout1 with the current threshold signal I_th and generate a square wave signal SP based on the comparison result.

In one embodiment, when the current feedback signal Iout1 increases to the current threshold signal I_th, the square wave signal SP is logic high. And when the current feedback signal Iout1 decreases to the current threshold signal I_th, the square wave signal SP changes from logic high to logic low.

In another embodiment, the current limiting circuit 201 is configured to perform hysteretic comparison by comparing the current feedback signal Iout1 with a first current threshold signal I_th1 and a second current threshold signal I_th2, and generate the square wave signal SP. When the current feedback signal Iout1 increases to higher than or equal to the first current threshold signal I_th1, the current limiting current 201 outputs the square wave signal SP with logic high. When the current feedback signal Iout1 decreases to lower than or equal to the second current threshold signal I_th2, the current limiting current 201 outputs the square wave signal SP with logic low. In one embodiment, the first current threshold signal I_th1 is higher than the second current threshold signal I_th2.

The over-current indication circuit 202 is coupled to the output terminal of the current limiting circuit 201 to receive the square wave signal SP and configured to generate an over-current indication signal SE based on the square wave signal SP. In one embodiment, when a rising edge of the square wave signal SP comes, the over-current indication circuit 202 outputs the over-current indication signal SE with logic high after a first delay TD1, to indicate over-current. When a falling edge of the square wave signal SP comes, the over-current indication circuit 202 outputs the over-current indication signal SE with logic low, to indicate the elimination of over-current. In one embodiment, the first delay TD1 is set to be 2 ms.

The over-current threshold selecting circuit 203 is configured to select a first over-current threshold voltage $I_{LIM\_SET1}$ or a second over-current threshold voltage $I_{LIM\_SET2}$ as an over-current threshold voltage $I_{LIM}$, wherein the first over-current threshold voltage $I_{LIM\_SET1}$ is higher than the second over-current threshold voltage $I_{LIM\_SET2}$. In one embodiment, the first over-current threshold voltage $I_{LIM\_SET1}$ is 1.6 times the second over-current threshold voltage $I_{LIM\_SET2}$. In another embodiment, when the over-current indication signal SE is logic high indicating the occurrence of overload, the over-current threshold selecting circuit 203 selects the lower second over-current threshold voltage $I_{LIM\_SET2}$ as the over-current threshold voltage $I_{LIM}$. When the over-current indication signal SE is logic low indicating the elimination of overload, the over-current threshold selecting circuit 203 selects the higher first over-current threshold voltage $I_{LIM\_SET1}$ as the over-current threshold voltage $I_{LIM}$. In practical applications, the over-current indication signal SE is initialized with logic low, and the over-current threshold voltage $I_{LIM}$ is initialized to be the higher first over-current threshold voltage $I_{LIM\_SET1}$.

When the current feedback signal Iout1 reaches the over-current threshold voltage $I_{LIM}$, a CC control loop is configured to control the output current Iout to be a constant current. When the current feedback signal Iout1 is lower than the over-current threshold voltage $I_{LIM}$, a CV control loop is configured to control the output voltage Vout to be a constant voltage.

The first EA 204 has a first input terminal, a second input terminal and an output terminal, wherein the first input terminal is configured to receive the current feedback signal Iout1, the second input terminal is coupled to the output terminal of the over-current threshold selecting circuit 203 to receive the over-current threshold voltage $I_{LIM}$. The first EA 204 is configured to generate a first compensation signal COMP1 based on the error between the current feedback signal Iout1 and the over-current threshold voltage $I_{LIM}$.

The output voltage detection circuit 205 is coupled to the power terminal PMID of the integrated circuit 20, and is configured to detect the output voltage Vout at the power terminal PMID, and generate a voltage feedback signal Vout1 indicative of the output voltage Vout.

The second EA 206 has a first input terminal, a second input terminal and an output terminal, wherein the first input terminal is configured to receive a reference voltage signal Vref1, the second input terminal is configured to receive the voltage feedback signal Vout1 indicative of the output voltage Vout. The second EA 206 is configured to generate a second compensation signal COMP2 based on the error between the reference voltage signal Vref1 and the voltage feedback signal Vout1.

The selecting circuit 207 has a first input terminal, a second input terminal and an output terminal, wherein the first input terminal is coupled to the output terminal of the first EA 204 to receive the first compensation signal COMP1, the second input terminal is coupled to the output terminal of the second EA 206 to receive the second compensation signal COMP2, and the output terminal is coupled to the PWM circuit 208 to provide a compensation signal COMP. The selecting circuit 207 is configured to select the lower value between the first compensation signal COMP1 and the second compensation signal COMP2 as the compensation signal COMP, and provide the compensation signal COMP to the output terminal.

The PWM circuit 208 is coupled to the output terminal of the selecting circuit 207 to receive the first compensation signal COMP1 or the second compensation signal COMP2. When the current feedback signal Iout1 is lower than the over-current threshold voltage Ioon, the PWM circuit 208 is configured to generate a control signal CTRL based on the second compensation signal COMP2. And the control signal CTRL is configured to control the power switches OH and QL of the bi-directional DC/DC converter 21 through the driving circuit 209, to regulate the output voltage Vout to be a constant voltage. When the current feedback signal Iout1 reaches the over-current threshold voltage $I_{LIM}$, the PWM circuit 208 is configured to generate the control signal CTRL based on the first compensation signal COMP1. And the control signal CTRL is configured to control the power switches OH and QL of the bi-directional DC/DC converter 21 to regulate the output current Iout to be a constant current.

Figure 3:
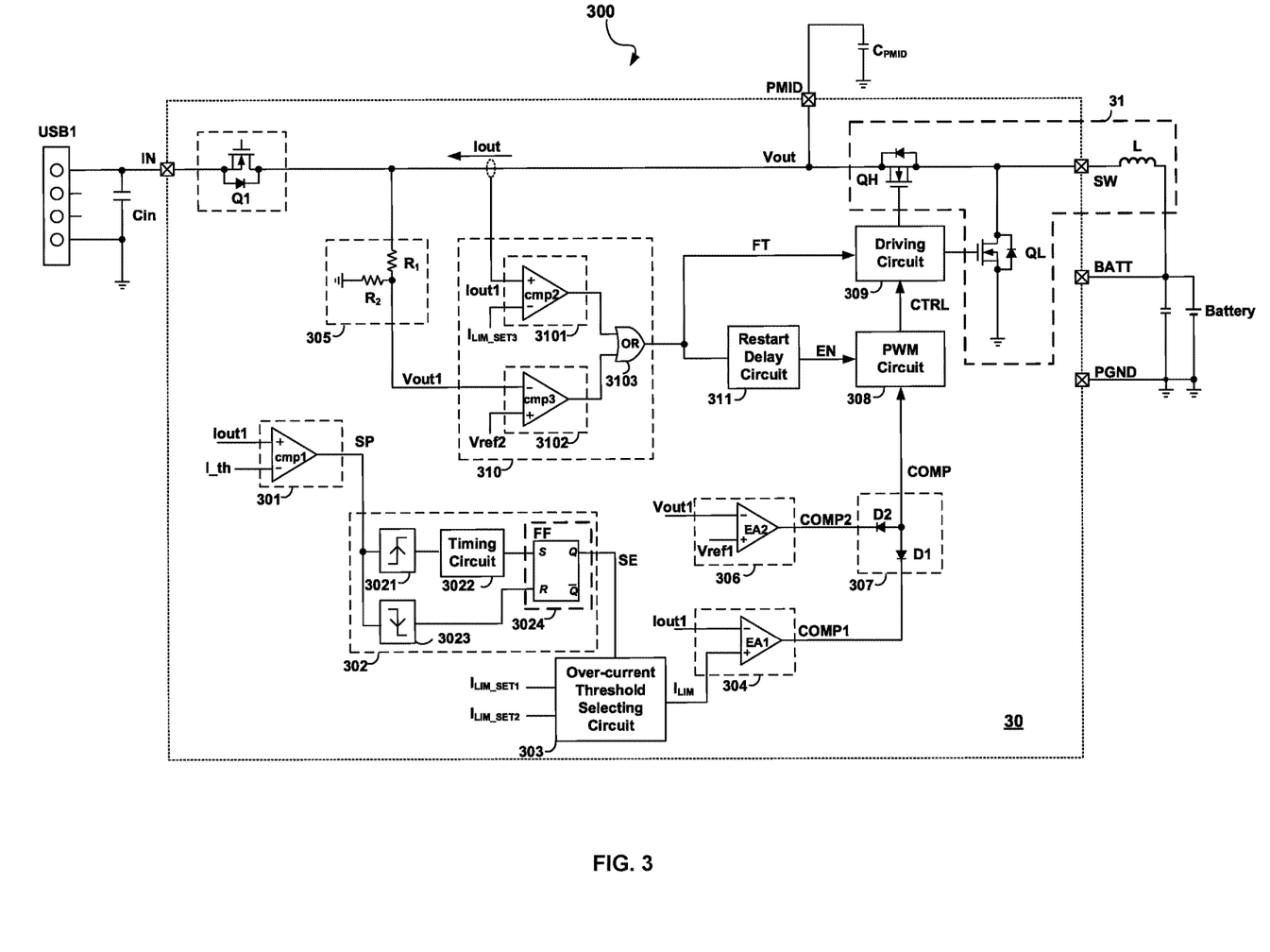
FIG. 3 illustrates a power management circuit 300 in accordance with another embodiment of the present invention.

FIG. 3 illustrates a power management circuit 300 in accordance with another embodiment of the present invention. In the example shown in FIG. 3, the power management circuit 300 comprises an integrated circuit 30, an input capacitor Cin, a rechargeable battery, an inductor L, an output capacitor CPMID and a battery capacitor Cbatt. The integrated circuit 30 comprises a power input terminal IN, a power terminal PMID, a switch node terminal SW, a battery terminal BATT, a ground terminal PGND, a first switch Q1, a first power switch QH, a second power switch QL and a control circuit used in the integrated circuit 30.

The first power switch QH, the second power switch QL and the inductor L construct a bi-directional DC/DC converter 31. The control circuit used in the integrated circuit 30 comprises a current limiting circuit 301, an over-current indication circuit 302, an over-current threshold selecting circuit 303, a first EA 304, an output voltage detection circuit 305, a second EA 306, a selecting circuit 307, a PWM circuit 308, a driving circuit 209, a fault monitoring circuit 310 and a restart delay circuit 311.

In the example shown in FIG. 3, the current limiting circuit 301 comprises a first comparator CMP1 having a non-inverting input terminal, an inverting input terminal and an output terminal, wherein the inverting input terminal is configured to receive the current threshold signal I_th, and the non-inverting input terminal is configured to receive the current feedback signal Iout1 indicative of the output current Iout flowing out of the power terminal PMID. The first comparator CMP1 is configured to compare the current feedback signal Iout1 with the current threshold signal I_th and generate a square wave signal SP at the output terminal based on the comparison result.

The over-current indication circuit 304 comprises a rising edge flip-flop 3021, a timing circuit 3022, a falling edge flip-flop 3023 and a logic circuit 3024. The rising edge flip-flop 3021 has an input terminal and an output terminal, wherein the input terminal is coupled to the output terminal of the current limiting circuit 301 to receive the square wave signal SP, and the output terminal outputs a rising edge pulse signal at a rising edge of the square wave signal SP.

The timing circuit 3022 has an input terminal and an output terminal, wherein the input terminal is coupled to the output terminal of the rising edge flip-flop 3021. The timing circuit 3022 receives the rising edge pulse signal and outputs a delay pulse signal after a first delay TD1.

The falling edge flip-flop 3023 has an input terminal and an output terminal, wherein the input terminal is coupled to the output terminal of the current limiting circuit 301 to receive the square wave signal SP and the output terminal outputs a falling edge pulse signal at a falling edge of the square wave signal SP.

The logic circuit 3024 has a set terminal, a reset terminal and an output terminal, wherein the set terminal is coupled to the output terminal of the timing circuit 3022 to receive the delay pulse signal, the reset terminal is coupled to the output terminal of the falling edge flip-flop 3023 to receive the falling edge pulse signal. The logic circuit 3024 is configured to generate an over-current indication signal SE at the output terminal. In the example shown in FIG. 3, the logic circuit 3024 comprises a SR flip-flop FF. In other embodiments, the logic circuit 3024 can comprises lots of logic gate circuits.

When the over-current indication signal SE is at a first logic level, e.g., logic high, the over-current threshold selecting circuit 303 selects the lower second over-current threshold voltage $I_{LIM\_SET2}$ as the over-current threshold voltage $I_{LIM}$. When the over-current indication signal SE is at a second logic level, e.g., logic low, the over-current threshold selecting circuit 303 selects the higher first over-current threshold voltage $I_{LIM\_SET1}$ as the over-current threshold voltage $I_{LIM}$.

The output voltage detection circuit 305 has an input terminal coupled to the power terminal PMID and voltage-dividing resistors R1 and R2. The output voltage detection circuit 305 provides a voltage feedback signal Vout1 indicative of the output voltage Vout at the common terminal of the resistors R1 and R2. The first EA 304 has a non-inverting terminal, an inverting terminal and an output terminal, wherein the non-inverting terminal is configured to receive the over-current threshold voltage $I_{LIM}$, the inverting terminal is configured to receive the current feedback signal Iout1, and the output terminal is configured to provide a first compensation signal COMP1. The second EA 306 has a non-inverting terminal, an inverting terminal and an output terminal, wherein the inverting terminal is coupled to the output terminal of the output voltage detection circuit 305 to receive the voltage feedback signal Vout1, the non-inverting terminal is configured to receive a reference voltage signal Vref1, and the output terminal is configured to provide a second compensation signal COMP2.

The selecting circuit 307 comprises diodes D1 and D2. The diodes D1 and D2 both has cathodes and anodes, wherein the cathode of diode D1 is coupled to the output terminal of the first EA 304 to receive the first compensation signal COMP1, and the cathode of diode D2 is coupled to the output terminal of the second EA 306 to receive the second compensation signal COMP2. The anodes of diodes D1 and D2 are coupled together and further coupled to the PWM circuit 308 to provide a compensation signal COMP.

When the current feedback signal Iout1 is higher than or equal to the over-current threshold voltage $I_{LIM}$, the first compensation signal COMP1 is lower than the second compensation signal COMP2. The diode D2 is turned off while the diode D1 is turned on, the selecting circuit 307 provides the first compensation signal COMP1 to the PWM circuit 308. The PWM circuit 308 generates a control signal CTRL based on the first compensation signal COMP1 to regulate the output current Iout to be an expected current, i.e., the CC control loop works and controls the output current Iout to be a constant current.

When the current feedback signal Iout1 is lower than the over-current threshold voltage Ioon, the first compensation signal COMP1 is higher than the second compensation signal COMP2. The diode D2 is turned on while the diode D1 is turned off, the selecting circuit 307 provides the second compensation signal COMP2 to the PWM circuit 308. The PWM circuit 308 generates the control signal CTRL based on the second compensation signal COMP2, i.e., the CV control loop works and regulates the output voltage Vout to be a constant voltage related to the reference voltage signal Vref1.

Furthermore, the fault monitoring circuit 310 has an input terminal and an output terminal, wherein the input terminal is configured to receive the voltage feedback signal Vout1 and the current feedback signal Iout1, and the output terminal is configured to provide a protection signal FT. When the power management circuit 300 is detected in a fault state, the protection signal FT is effective, and the power management circuit 300 is triggered to enter a hiccup mode.

The restart delay circuit 311 has an input terminal and an output terminal, wherein the input terminal is configured to receive the protection signal FT. The restart delay circuit 311 provides an enable signal EN at the output terminal after a second delay TD2. When the protection signal FT is effective, the power management circuit 300 enters the hiccup mode. And after the second delay TD2, the enable signal EN is effective, the power management circuit 300 tries to restart.

The fault monitoring circuit 310 comprises a first monitoring circuit 3101, a second monitoring circuit 3102 and an OR gate circuit 3103. The first monitoring circuit 3101 receives the current feedback signal Iout1 and a third over-current threshold voltage $I_{LIM\_SET3}$. An output terminal of the first monitoring circuit 3101 is coupled to the OR gate circuit 3103. The first monitoring circuit 3101 comprises a second comparator CMP2. When the current feedback signal Iout1 is higher than the third over-current threshold voltage $I_{LIM\_SET3}$, the fault monitoring circuit 310 outputs the protection signal FT to trigger the hiccup mode, wherein the third over-current threshold voltage $I_{LIM\_SET3}$ is higher than the first over-current threshold voltage $I_{LIM\_SET1}$. The second monitoring circuit 3102 receives the voltage feedback signal Vout1 and a short-circuit threshold voltage Vref2. An output terminal of the second monitoring circuit 3102 is coupled to the OR gate circuit 3103. The second monitoring circuit 3102 comprises a third comparator CMP3. When the voltage feedback signal Vout1 is lower than the short-circuit threshold voltage Vref2, the fault monitoring circuit 310 outputs the protection signal FT to trigger the hiccup mode.

Figure 4:
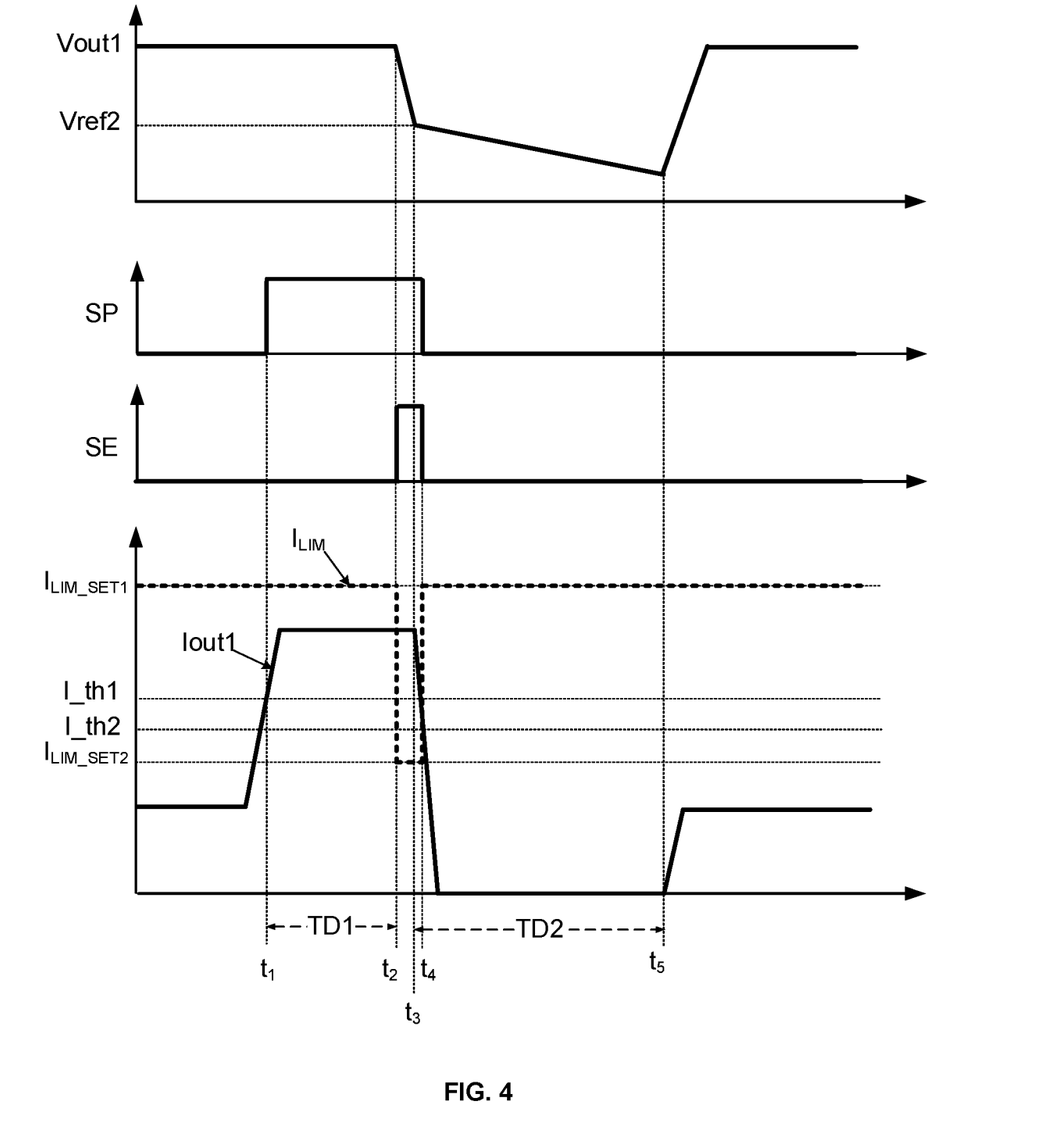
FIG. 4 illustrates a working waveform of a power management circuit 300 shown in FIG. 3, in accordance with an embodiment of the present invention.

FIG. 4 illustrates a working waveform of a power management circuit 300 shown in FIG. 3, in accordance with an embodiment of the present invention. As shown in FIG. 4, before time t1, the square wave signal SP and the over-current indication signal SE both remain logic low, the over-current threshold voltage $I_{LIM}$ is configured to be the first over-current threshold voltage $I_{LIM\_SET1}$, the CV control loop works, the output voltage Vout remains unchanged, and the voltage feedback signal Vout1 also remains constant.

At time t1, the current feedback signal Iout1 increases to higher than or equal to the first current threshold signal I_th1, the square wave signal SP changes from logic low to logic high, and the timing circuit 2033 starts to time a first delay TD1. In one embodiment, the first current threshold signal I_th1 is 1.1 times the second over-current threshold voltage $I_{LIM\_SET2}$.

At time t2, the first delay TD1 timing ends, the over-current indication signal SE changes from logic low to logic high, the over-current threshold voltage $I_{LIM}$ changes from the first over-current threshold voltage $I_{LIM\_SET1}$ to the second over-current threshold voltage $I_{LIM\_SET2}$. At this time, the current feedback signal Iout1 is higher than the over-current threshold voltage $I_{LIM}$, the CC control loop replaces the CV control loop to work and the output current Iout is controlled to be a constant current. The output voltage Vout at the power terminal PMID of the power management circuit 300 starts to decrease, and the voltage feedback signal Vout1 starts to decrease accordingly. In one embodiment, the first over-current threshold voltage $I_{LIM\_SET1}$ is 1.6 times the second over-current threshold voltage $I_{LIM\_SET2}$. In another embodiment, the first delay TD1 is 2 ms.

At time t3, the voltage feedback signal Vout1 decreases to the short-circuit threshold voltage Vref2, the hiccup mode is triggered. The integrated circuit 30 stops working, the power management circuit 300 is turned off and enters the hiccup mode. The restart delay circuit 311 starts to time a second delay TD2.

At time t4, the current feedback signal Iout1 decreases to lower than or equal to the second current threshold signal I_th2, the square wave signal SP changes from logic high to logic low, the over-current indication signal SE changes from logic high to logic low, and the over-current threshold voltage $I_{LIM}$ changes from the second over-current threshold voltage $I_{LIM\_SET2}$ to the first over-current threshold voltage $I_{LIM\_SET1}$. In one embodiment, the second current threshold signal I_th2 is 1.05 times the second over-current threshold voltage $I_{LIM\_SET2}$.

At time t5, the second delay TD2 timing ends, the power management circuit 300 recovers to work and exits the hiccup mode.

As shown in FIG. 4, the power management circuit 300 can allow a maximum of 1.6 times overload for a duration of 2 ms. In addition, during the 2 ms, the current feedback signal Iout1 is higher than a preset current and the output voltage Vout is not lower than 2V, which can meet the product standard of Apple.

Figure 5:
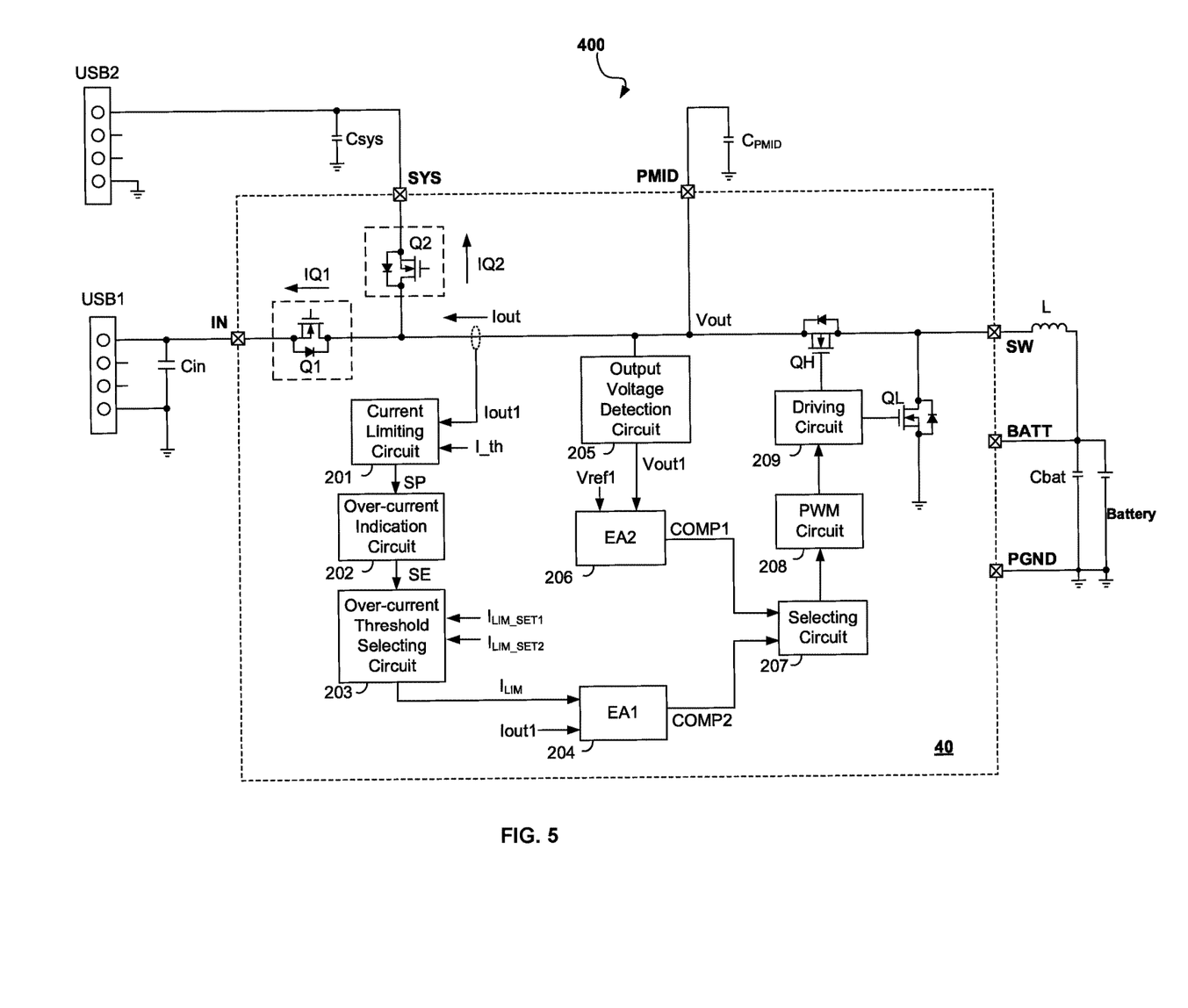
FIG. 5 illustrates a power management circuit 400 in accordance with another embodiment of the present invention.

FIG. 5 illustrates a power management circuit 400 in accordance with another embodiment of the present invention. The differences between the power management circuit 200 shown in FIG. 2 and the power management circuit 400 are that the integrated circuit 40 of the power management circuit 400 further comprises a system terminal SYS and a second switch Q2. The system terminal SYS is coupled to a capacitor Csys and coupled to a second load via an USB port USB2. The second switch Q2 is coupled between the system terminal SYS and the power terminal PMID.

When an input voltage exists at the power input terminal IN and the system terminal SYS is coupled to the second load, the input voltage provides a supply voltage to the power management circuit 400. Specifically, the first switch Q1 is turned on to transfer the input voltage to the power terminal PMID via the first switch Q1 for providing an output voltage Vout. The second switch Q2 is also turned on to transfer the output voltage at the power terminal PMID to the system terminal SYS for supplying power to the second load.

When the power input terminal IN and the system terminal SYS are both coupled to loads, the power management circuit 400 supplies power to the two loads. The first switch Q1 and the second switch Q2 are both turned on to transfer the output voltage Vout respectively to the power input terminal IN and the system terminal SYS for supplying power to the two loads at the same time, and providing an output current Iout flowing out of the power terminal PMID. Wherein the output current Iout is a sum of a current flowing through the first switch Q1 and a current flowing through the second switch Q2, i.e., Iout=$I_{Q1}$+$I_{Q2}$. In one embodiment, the first switch Q1 and the second switch Q2 can be used as current sense transistors for sensing a current flowing through the power terminal PMID.

Figure 6:
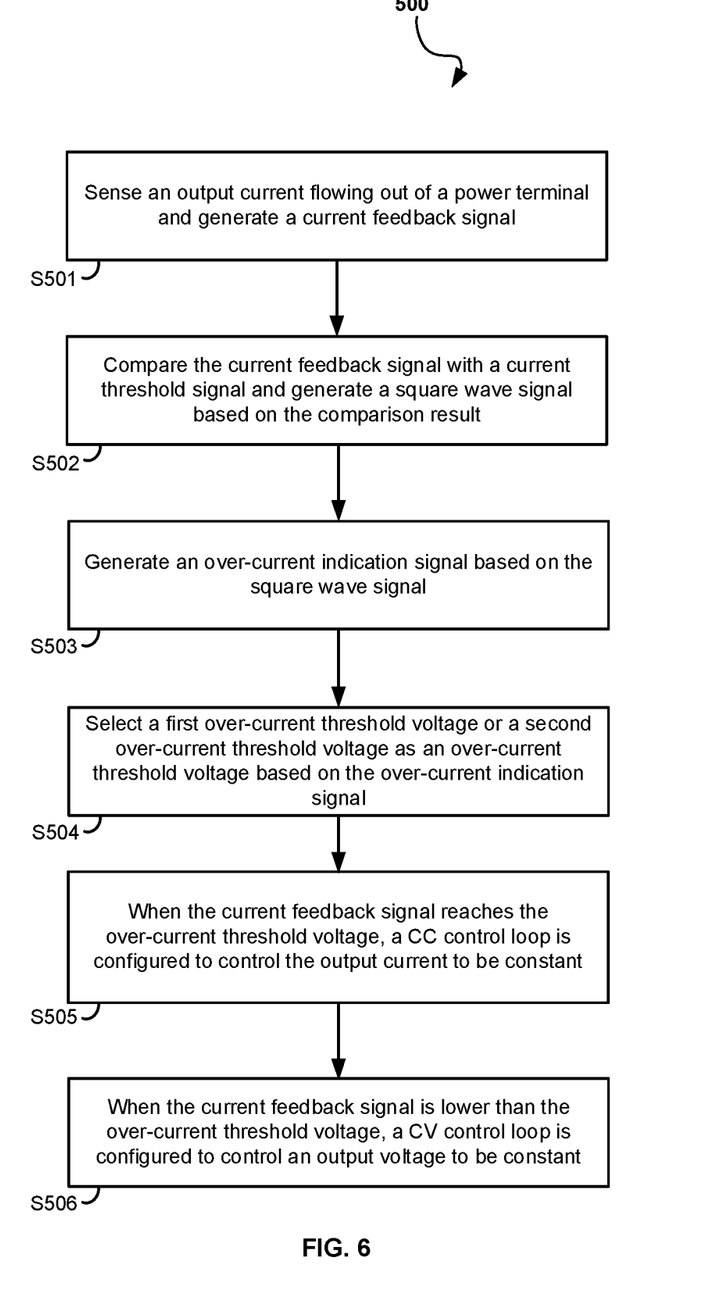
FIG. 6 illustrates a working flowchart of an over-current protection method 500 used in a power management circuit in accordance with an embodiment of the present invention.

FIG. 6 illustrates a working flowchart of an OCP method 500 used in a power management circuit in accordance with an embodiment of the present invention. The power management circuit comprises a first switch coupled between a power input terminal and a power terminal, a bi-directional DC/DC converter coupled between the power terminal and a battery terminal, and a rechargeable battery coupled to the battery terminal. When the power input terminal is coupled to a first load, the bi-directional DC/DC converter boosts a battery voltage to an output voltage at the power terminal, and transfers the output voltage to the power input terminal for supplying power to the first load. The OCP method includes steps S501-S506.

At step S501, the output current flowing out of the power terminal is detected and a current feedback signal is generated.

At step S502, the current feedback signal is compared with a current threshold signal and a square wave signal is generated based on the comparison result. In one embodiment, when the current feedback signal increases to the current threshold signal, the square wave signal is logic high; when the current feedback signal decreases to the current threshold signal, the square wave signal is logic low.

At step S503, an over-current indication signal is generated based on the square wave signal. In one embodiment, when the square wave signal changes from logic low to logic high, i.e., when a rising edge of the square wave signal comes, timing is started. After timing a first delay, the over-current indication signal changes form logic low to logic high. When the square wave signal changes from logic high to logic low, i.e., when a falling edge of the square wave signal comes, the over-current indication signal changes form logic high to logic low.

At step S504, a first over-current threshold voltage or a second over-current threshold voltage is selected as an over-current threshold voltage based on the over-current indication signal, wherein the first over-current threshold voltage is higher than the second over-current threshold voltage. In one embodiment, when the over-current indication signal is logic low, the first over-current threshold voltage is selected as the over-current threshold voltage; when the over-current indication signal is logic high, the second over-current threshold voltage is selected as the over-current threshold voltage.

At step S505, when the current feedback signal reaches the over-current threshold voltage, a CC control loop receiving the current feedback signal and the over-current threshold voltage is configured to control the output current to be a constant current.

At step S506, when the current feedback signal is lower than the over-current threshold voltage, a CV control loop is configured to control the output voltage to be a constant voltage.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Although many detailed circuits are shown in the embodiments above, it is apparent to persons of ordinary skills in the art that, these detailed circuits are only used for illustration purpose only, and are not intended to limit the present invention. Other suitable circuit structure with same or similar function could also be utilized. Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. An integrated circuit adapted for use with a first load, a battery, an inductor and an output capacitor, the integrated circuit comprising:
   a first terminal for providing an output voltage;
   a first switch coupled between the first terminal and a second terminal;
   a first power switch coupled between the first terminal and a third terminal;
   a second power switch coupled to the third terminal;
   a control circuit configured to boost a battery voltage of the battery to the output voltage at the first terminal, and wherein the control circuit turns on the first switch to transfer the output voltage at the first terminal to the second terminal for supplying power to the first load when the second terminal is coupled to the first load, wherein the control circuit comprises:
      a current limiting circuit configured to receive a current threshold signal and a current feedback signal indicative of an output current flowing out of the first terminal, the current limiting circuit compares the current feedback signal with the current threshold signal and generates a square wave signal;
      an over-current indication circuit coupled to an output terminal of the current limiting circuit to receive the square wave signal and configured to output an over-current indication signal based on the square wave signal; and
      an over-current threshold selecting circuit configured to select a first over-current threshold voltage or a second over-current threshold voltage as an over-current threshold voltage based on the over-current indication signal, wherein the first over-current threshold voltage is higher than the second over-current threshold voltage.

2. The integrated circuit of claim 1, wherein the output current flowing out of the first terminal is controlled to be a constant current when the current feedback signal reaches the over-current threshold voltage, and wherein the output voltage at the first terminal is controlled to be a constant voltage when the current feedback signal is lower than the over-current threshold voltage.

3. The integrated circuit of claim 2, wherein the over-current indication circuit comprises:
   a rising edge flip-flop having an input terminal and an output terminal, wherein the input terminal is coupled to the output terminal of the current limiting circuit to receive the square wave signal, and based on the square wave signal, the output terminal outputs a rising edge pulse signal at a rising edge of the square wave signal;
   a timing circuit having an input terminal and an output terminal, wherein the input terminal is coupled to the output terminal of the rising edge flip-flop to receive the rising edge pulse signal, and the output terminal outputs a delay pulse signal after a first delay;
   a falling edge flip-flop having an input terminal and an output terminal, wherein the input terminal is coupled to the output terminal of the current limiting circuit to receive the square wave signal, and based on the square wave, the output terminal outputs a falling edge pulse signal at a falling edge of the square wave signal; and
   a logic circuit having a set terminal, a reset terminal and an output terminal, wherein the set terminal is coupled to the output terminal of the timing circuit to receive the delay pulse signal, the reset terminal is coupled to the output terminal of the falling edge flip-flop to receive the falling edge pulse signal, and the output terminal outputs the over-current indication signal.

4. The integrated circuit of claim 2, wherein
   when the over-current indication signal is at a first logic level, the over-current threshold selecting circuit is configured to select the second over-current threshold voltage as the over-current threshold voltage; and
   when the over-current indication signal is at a second logic level, the over-current threshold selecting circuit is configured to select the first over-current threshold voltage as the over-current threshold voltage.

5. The integrated circuit of claim 2, wherein the first over-current threshold voltage is 1.6 times the second over-current threshold voltage.

6. The integrated circuit of claim 2, further comprises:
   a second switch coupled between a fourth terminal and the first terminal, wherein the second switch is turned on to transfer the output voltage at the first terminal to the fourth terminal for supplying power to a second load; and
   wherein the output current flowing out of the first terminal is a sum of a current flowing through the first switch and a current flowing through the second switch.

7. The integrated circuit of claim 2, wherein the control circuit further comprises:
- a fault monitoring circuit configured to receive the current feedback signal, and a third over-current threshold voltage, and when the current feedback signal increases to the third over-current threshold voltage, the fault monitoring circuit outputs a protection signal to trigger a hiccup mode, wherein the third over-current threshold voltage is higher than the first over-current threshold voltage.

8. A power management circuit, comprising:
- a first terminal for providing an output voltage;
- a first switch coupled between the first terminal and a second terminal;
- a bi-directional DC/DC converter coupled between the first terminal and a third terminal;
- a control circuit configured to boost a battery voltage at the third terminal to the output voltage at the first terminal through the bi-directional DC/DC converter, and wherein the control circuit turns on the first switch to transfer the output voltage at the first terminal to the second terminal for supplying power to a first load when the second terminal is coupled to the first load, the control circuit comprises:
- a current limiting circuit configured to receive a current threshold signal and a current feedback signal indicative of an output current flowing out of the first terminal, the current limiting circuit compares the current feedback signal with the current threshold signal and generates a square wave signal at an output terminal;
- an over-current indication circuit coupled to the output terminal of the current limiting circuit to receive the square wave signal and configured to output an over-current indication signal based on the square wave signal; and
- an over-current threshold selecting circuit configured to select a first over-current threshold voltage or a second over-current threshold voltage as an over-current threshold voltage based on the over-current indication signal, wherein the first over-current threshold voltage is higher than the second over-current threshold voltage.

9. The power management circuit of claim 8, wherein the output current flowing out of the first terminal is controlled to be a constant current when the current feedback signal reaches the over-current threshold voltage, and wherein the output voltage at the first terminal is controlled to be a constant voltage when the current feedback signal is lower than the over-current threshold voltage.

10. The power management circuit of claim 9, wherein the over-current indication circuit comprises:
- a rising edge flip-flop having an input terminal and an output terminal, wherein the input terminal is coupled to the output terminal of the current limiting circuit to receive the square wave signal, and based on the square wave signal, the output terminal outputs a rising edge pulse signal at a rising edge of the square wave signal;
- a timing circuit having an input terminal and an output terminal, wherein the input terminal is coupled to the output terminal of the rising edge flip-flop to receive the rising edge pulse signal, and the output terminal outputs a delay pulse signal after a first delay;
- a falling edge flip-flop having an input terminal and an output terminal, wherein the input terminal is coupled to the output terminal of the current limiting circuit to receive the square wave signal, and based on the square wave, the output terminal outputs a falling edge pulse signal at a falling edge of the square wave signal; and
- a logic circuit having a set terminal, a reset terminal and an output terminal, wherein the set terminal is coupled to the output terminal of the timing circuit to receive the delay pulse signal, the reset terminal is coupled to the output terminal of the falling edge flip-flop to receive the falling edge pulse signal, and the output terminal outputs the over-current indication signal.

11. The power management circuit of claim 9, wherein when the over-current indication signal is at a first logic level, the over-current threshold selecting circuit is configured to select the second over-current threshold voltage as the over-current threshold voltage; and
when the over-current indication signal is at a second logic level, the over-current threshold selecting circuit is configured to select the first over-current threshold voltage as the over-current threshold voltage.

12. The power management circuit of claim 9, wherein the first over-current threshold voltage is 1.6 times the second over-current threshold voltage.

13. The power management circuit of claim 9, further comprises:
- a second switch coupled between a fourth terminal and the first terminal, wherein the second switch is turned on to transfer the output voltage at the first terminal to the fourth terminal for supplying power to a second load; and
- wherein the output current flowing out of the first terminal is a sum of a current flowing through the first switch and a current flowing through the second switch.

14. The power management circuit of claim 9, wherein the control circuit further comprises:
- a fault monitoring circuit configured to receive the current feedback signal, and a third over-current threshold voltage, and when the current feedback signal increases to the third over-current threshold voltage, the fault monitoring circuit outputs a protection signal to trigger a hiccup mode, wherein the third over-current threshold voltage is higher than the first over-current threshold voltage.

15. An over-current protection method used in a power management circuit, wherein the power management circuit has a first switch coupled between a power input terminal and a power terminal, a bi-directional DC/DC converter coupled between the power terminal and a battery terminal, and wherein the bi-directional DC/DC converter is configured to boost a battery voltage at the battery terminal to an output voltage at the power terminal and the first switch is turned on to transfer the output voltage at the power terminal to the power input terminal for supplying power to a first load when the power input terminal is coupled to the first load, the over-current protection method comprising:
- sensing an output current flowing out of the power terminal and generating a current feedback signal;
- comparing the current feedback signal with a current threshold signal and generating a square wave signal based on the comparison result;
- generating an over-current indication signal based on the square wave signal; and
- selecting a first over-current threshold voltage or a second over-current threshold voltage as an over-current threshold voltage based on the over-current indication signal, wherein the first over-current threshold voltage is higher than the second over-current threshold voltage.

16. The over-current protection method of claim 15, wherein the output current flowing out of the power terminal is controlled to be a constant current when the current feedback signal reaches the over-current threshold voltage, and wherein the output voltage at the power terminal is controlled to be a constant voltage when the current feedback signal is lower than the over-current threshold voltage.

17. The over-current protection method of claim 16, wherein the step for generating the over-current indication signal comprises:
   timing when a rising edge of the square wave signal comes, and after timing a first delay, the over-current indication signal changes from a first logic level to a second logic level; and
   when a falling edge of the square wave signal comes, the over-current indication signal changes from the second logic level to the first logic level.

18. The over-current protection method of claim 17, wherein:
   when the over-current indication signal is at the first logic level, selecting the first over-current threshold voltage as the over-current threshold voltage; and
   when the over-current indication signal is at the second logic level, selecting the second over-current threshold voltage as the over-current threshold voltage.

19. The over-current protection method of claim 18, wherein the first over-current threshold voltage is 1.6 times the second over-current threshold voltage.

20. The over-current protection method of claim 16, further comprises: when the output voltage decreases to a short-circuit threshold voltage, generating a protection signal to trigger a hiccup mode.

* * * * *